United States Patent
Wicker et al.

[19]

[11] Patent Number: 6,033,585
[45] Date of Patent: Mar. 7, 2000

[54] METHOD AND APPARATUS FOR PREVENTING LIGHTUP OF GAS DISTRIBUTION HOLES

[75] Inventors: Thomas E. Wicker, Vallejo; Albert J. Lamm, Morgan Hill; Vahid Vahedi, Albany, all of Calif.

[73] Assignee: Lam Research Corporation, Fremont, Calif.

[21] Appl. No.: 08/777,736

[22] Filed: Dec. 20, 1996

[51] Int. Cl.[7] .................................................... H05H 1/00
[52] U.S. Cl. ......................... 216/68; 156/345; 118/723 I
[58] Field of Search ...................... 156/345; 118/723 I; 216/68

[56] References Cited

U.S. PATENT DOCUMENTS

| | | |
|---|---|---|
| 4,340,462 | 7/1982 | Koch . |
| 4,579,618 | 4/1986 | Celestino et al. . |
| 4,948,458 | 8/1990 | Ogle . |
| 5,198,718 | 3/1993 | Davis et al. . |
| 5,200,232 | 4/1993 | Tappan et al. . |
| 5,241,245 | 8/1993 | Barnes et al. . |
| 5,262,029 | 11/1993 | Erskine et al. . |
| 5,304,279 | 4/1994 | Coultas et al. . |
| 5,401,350 | 3/1995 | Patrick et al. . |
| 5,433,812 | 7/1995 | Cuomo et al. . |
| 5,464,476 | 11/1995 | Gibb et al. . |
| 5,525,159 | 6/1996 | Hama et al. . |
| 5,529,657 | 6/1996 | Ishii . |
| 5,531,834 | 7/1996 | Ishizuka et al. . |
| 5,540,800 | 7/1996 | Qian ........................................ 156/345 |
| 5,580,385 | 12/1996 | Paranjpe et al. . |
| 5,614,055 | 3/1997 | Fairbairn et al. ....................... 156/345 |
| 5,650,032 | 7/1997 | Keller et al. ............................ 156/345 |
| 5,824,605 | 10/1998 | Chen et al. ............................. 156/345 |

FOREIGN PATENT DOCUMENTS

0674336 A1  3/1995  European Pat. Off. .

*Primary Examiner*—Thi Dang
*Attorney, Agent, or Firm*—Burns, Doane, Swecker & Mathis, L.L.P.

[57] ABSTRACT

A plasma processing chamber includes a substrate holder, a gas distribution member, and a shield for preventing lightup of plasma in gas distribution holes in the gas distribution member. The chamber can include an RF energy source such as an RF antenna which inductively couples RF energy through the gas distribution member to energize process gas into a plasma state. The shield can be arranged to allow capacitive coupling of RF energy into the processing chamber for lightup of plasma in the processing chamber and/or ion bombardment of the exposed surface of the gas distribution member for cleaning thereof during processing of the substrate.

20 Claims, 4 Drawing Sheets

METHOD AND APPARATUS FOR PREVENTING LIGHTUP OF GAS DISTRIBUTION HOLES

FIELD OF THE INVENTION

The invention relates to improvements in a plasma processing chamber and to a method of processing a substrate in the plasma processing chamber such as by plasma etching an oxide layer on a semiconductor wafer.

BACKGROUND OF THE INVENTION

Vacuum processing chambers are generally used for chemical vapor depositing (CVD) and etching of materials on substrates by supplying process gas to the vacuum chamber and application of a radio frequency (RF) field to the gas. Examples of parallel plate, transformer coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radio frequency power into the chamber, as disclosed in U.S. Pat. No. 4,579,618.

Plasma processing systems wherein an antenna coupled to a radio frequency (RF) source energizes gas into a plasma state within a process chamber are disclosed in U.S. Pat. Nos. 4,948,458; 5,198,718; 5,241,245; 5,304,279; and 5,401,350. In such systems, the antenna is located outside the process chamber and the RF energy is supplied into the chamber through a dielectric window. Such processing systems can be used for a variety of semiconductor processing applications such as etching, deposition, resist stripping, etc.

SUMMARY OF THE INVENTION

An object of the present invention is to improve uniformity of processing across a treated surface of a substrate, reduce particle contamination of processed substrates when substrates are processed continuously, reduce the clean time required to remove deposits/buildup such as polymer on a gas distribution member facing the substrate and/or increase throughput.

According to one aspect of the invention, a method of processing a substrate and improving uniformity of processing thereof comprises steps of: (a) placing a substrate on a substrate holder in a processing chamber, the processing chamber including a gas distribution member having an exposed surface facing the substrate, the gas distribution member including gas distribution holes through which process gas flows into a reaction zone adjacent the substrate; (b) flowing process gas through the gas distribution holes into the processing chamber and igniting the process gas in the processing chamber into a plasma state by capacitively coupling RF energy from an RF energy source through the gas distribution member and into the processing chamber, the processing chamber including a shield between the RF energy source and the gas distribution holes, the shield preventing lightup of plasma in the gas distribution holes without preventing capacitive coupling of RF energy from the RF energy source into the processing chamber for lightup of plasma in the processing chamber; (c) processing the substrate by inductively coupling RF energy from the RF energy source through the gas distribution member and maintaining the process gas in a plasma state in the processing chamber; (d) removing the substrate from the processing chamber; and (e) consecutively processing additional substrates in the processing chamber by repeating steps (a–d) while maintaining a desired spatial distribution of process gas flow through the gas distribution holes due to lack of lightup of plasma in the gas distribution holes.

According to another aspect of the invention, a plasma processing chamber comprises: a substrate holder for supporting a substrate within an interior of the processing chamber; a gas distribution member having an exposed surface facing the substrate, the gas distribution member including gas distribution holes through which process gas flows into the interior of the processing chamber into a reaction zone adjacent a substrate supported on the substrate holder; a gas supply supplying process gas through the gas distribution holes and into the reaction zone; an RF energy source supplying RF energy into the interior of the processing chamber and energizing the process gas into a plasma state for processing a substrate; and a shield between the RF energy source and the gas distribution holes, the shield preventing lightup of plasma in the gas distribution holes without preventing capacitive coupling of RF energy from the RF energy source into the processing chamber for lightup of plasma in the processing chamber.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

The invention provides improvements in achieving uniform processing of substrates such as semiconductor wafers, flat panel display substrates, and the like. The uniform processing can be achieved by utilizing a shield which prevents lightup of plasma in holes of a gas distribution member arranged with an exposed surface thereof adjacent a substrate to be processed.

In plasma etching of substrates, features can be etched into layers of various materials on substrates such as silicon wafers. In such etching processes, a gas distribution member can be used to control the spatial distribution of gas flow in the volume of the reactor above the plane of the wafer. In the TCP 9100™ plasma etching reactor available from LAM Research Incorporated, the gas distribution member is a circular plate situated directly below the TCP™ window which is also the vacuum sealing surface at the top of the reactor in a plane above and parallel to the wafer. This gas distribution plate is sealed using an O-ring to a gas distribution ring located at the periphery of the gas distribution plate. The gas distribution ring feeds gas from a source into the volume defined by the gas distribution plate, an inside surface of a window underlying a coil supplying RF energy into the reactor, and the gas distribution ring. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material can be a dielectric to enable coupling of this RF power through the gas distribution plate into the reactor. Further, the material of the gas distribution plate can be highly resistant to chemical sputter-etching in environments such as oxygen or a hydrofluorocarbon gas plasma in order to avoid breakdown and the resultant particle generation associated therewith. Moreover, the material of the gas distribution plate may have low levels of contaminants that might otherwise affect performance of devices on the wafer.

According to the invention, it has surprisingly and unexpectedly been found that uniform processing of substrates can be achieved by shielding the holes of a gas distribution member such as a gas distribution plate such that lightup of plasma in the holes is avoided. The shield can also be arranged to allow enough capacitive coupling to achieve initial lightup of plasma in the processing chamber. Further, the shield can be arranged such that the gas distribution member is bombarded with ions to thereby reduce buildup of deposits thereon.

Figure 1:
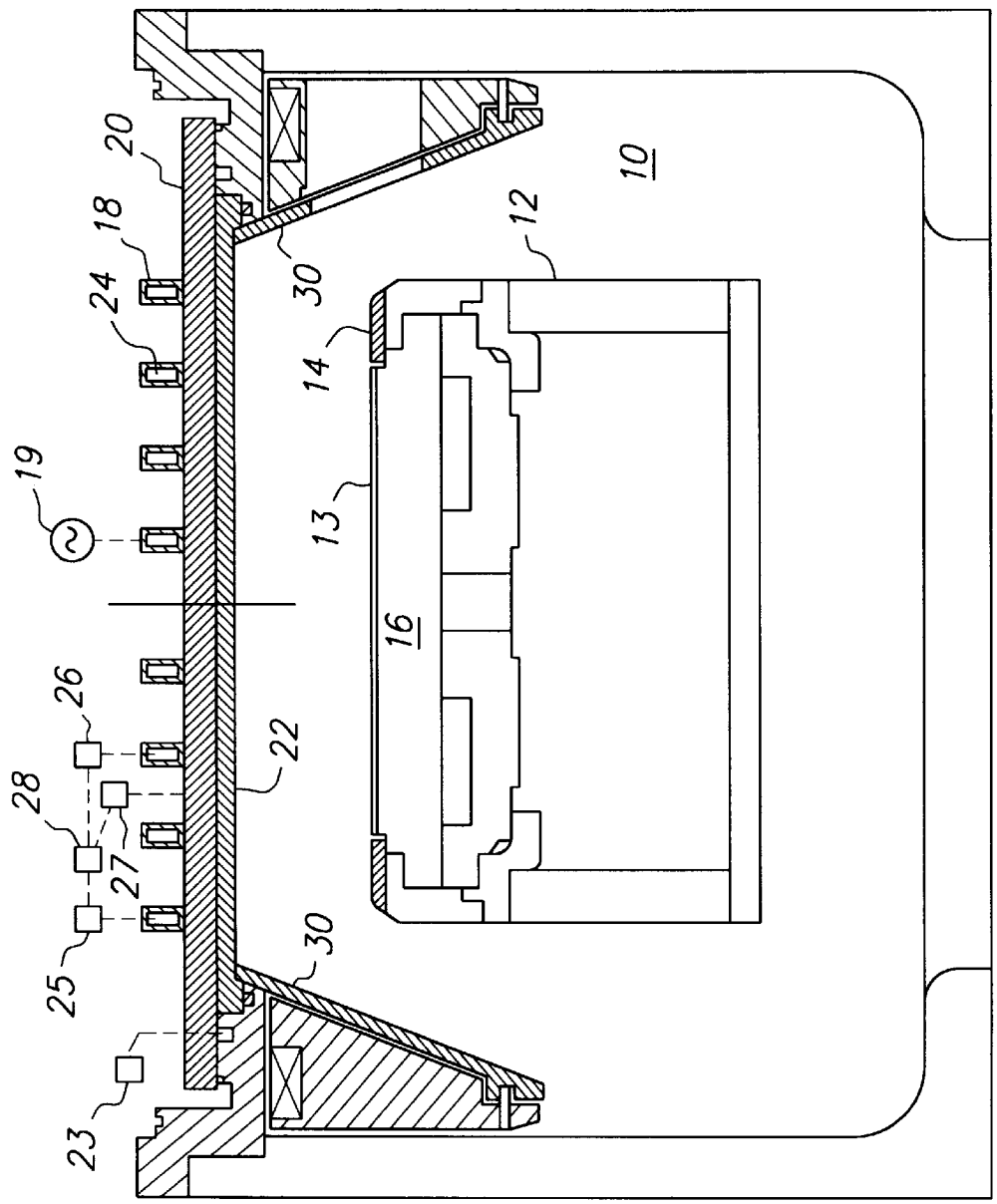
FIG. 1 is a cross sectional view of a vacuum processing chamber according to the invention.

Controlling of spatial distribution of gas flow is critical to obtaining uniform etch results in a plasma etch reactor. The common approach to controlling process uniformity is to flow the gas through a gas distribution plate (GDP), also referred to as a "showerhead" built into the top of the reactor directly above the wafer. FIG. 1 shows the GDP in a TCP™ reactor. Gas is introduced into a plenum around the periphery of the GDP, flows through the volume between the GDP and the plate immediately above it (referred to here as the TCP™ window), which forms the vacuum wall, and through the holes of the GDP into the volume above the wafer.

In systems where this showerhead is built into an RF powered electrode, or in the case of TCP™, where it is located directly under an RF powered antenna, strong electric fields can cause unwanted breakdown of the gas and formation of a discharge, referred to as "lightup," in the GDP holes and/or the volume between the GDP and the plate above it. To prevent this, spacing between these parts, and the diameter of the GDP holes are normally carefully controlled to a dimension smaller than is necessary to sustain a plasma at the E/p (where E is the electric field and p is the pressure) present in these regions. On high plasma density sources such as TCP™ this dimension is so small that it becomes difficult to maintain the gas conductance needed to supply the GDP holes with uniform pressure and flow. It also becomes extremely difficult to reproducibly form holes in the GDP small enough to prevent lightup.

Figure 6:
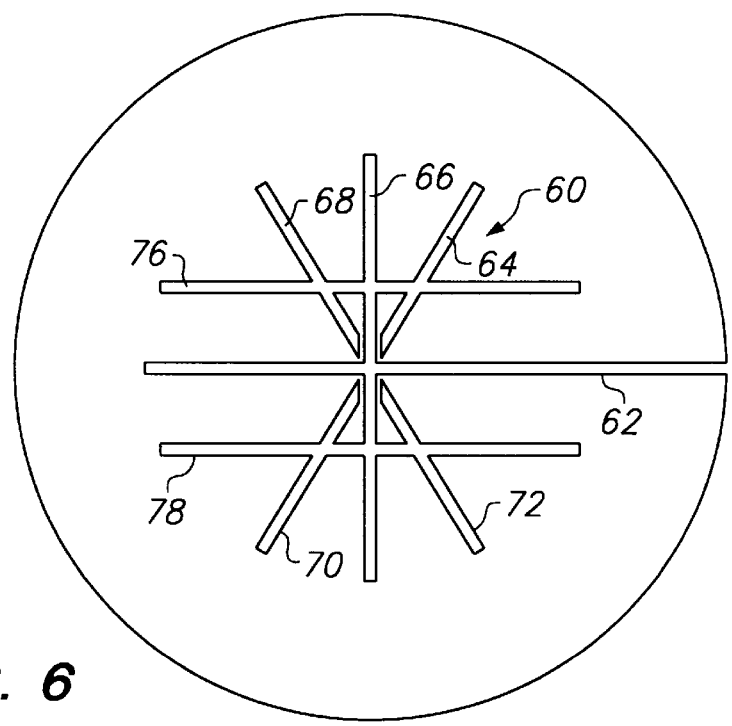
FIG. 6 is a top view of a shield in accordance with one embodiment of the invention.

One embodiment of this invention provides a method to prevent lightup by conducting the gas through shallow grooves defined on the backside of the GDP (the side facing the TCP™ window) and forming a metallized pattern on the adjacent face of the TCP™ window of the same image as, and aligned with, the grooves. A sample pattern is shown in FIG. 6. The metal pattern is grounded to the reactor top plate, shorting the RF field above the grooves and holes in the GDP so there is no capacitively coupled electric field to break down the gas in these regions. The GDP is spring-loaded against the TCP window for maximum heat transfer for temperature control and elimination of any voids large enough to cause lightup. The metal pattern does not interfere with the inductive coupling of RF power into the reactor.

The metallized pattern can be of any suitable material such as copper, tungsten, aluminum, silver-palladium, etc., and can be of various shapes and sizes as long as it covers the grooves and holes. The metallized pattern can comprise a sheet of metal or a film deposited by a suitable process such as silk screening. It also must not have a continuous conducting path azimuthally or current will be induced in it by the RF antenna. This would result in lost power and heating with possible destruction of the metal pattern.

In accordance with a preferred embodiment of the invention, the shield is constructed such that it permits some capacitive coupling to the plasma. Indeed, some capacitive coupling is desired to breakdown the gas and initiate the discharge. Some capacitive coupling is also desired in the case where in situ ion bombardment of the GDP issued to prevent excessive polymer buildup on its surface from the plasma during processing such as oxide etching using hydrofluorocarbon plasmas. In this embodiment, the metal is only located where necessary to prevent lightup in the gas delivery grooves and holes.

Figure 7:
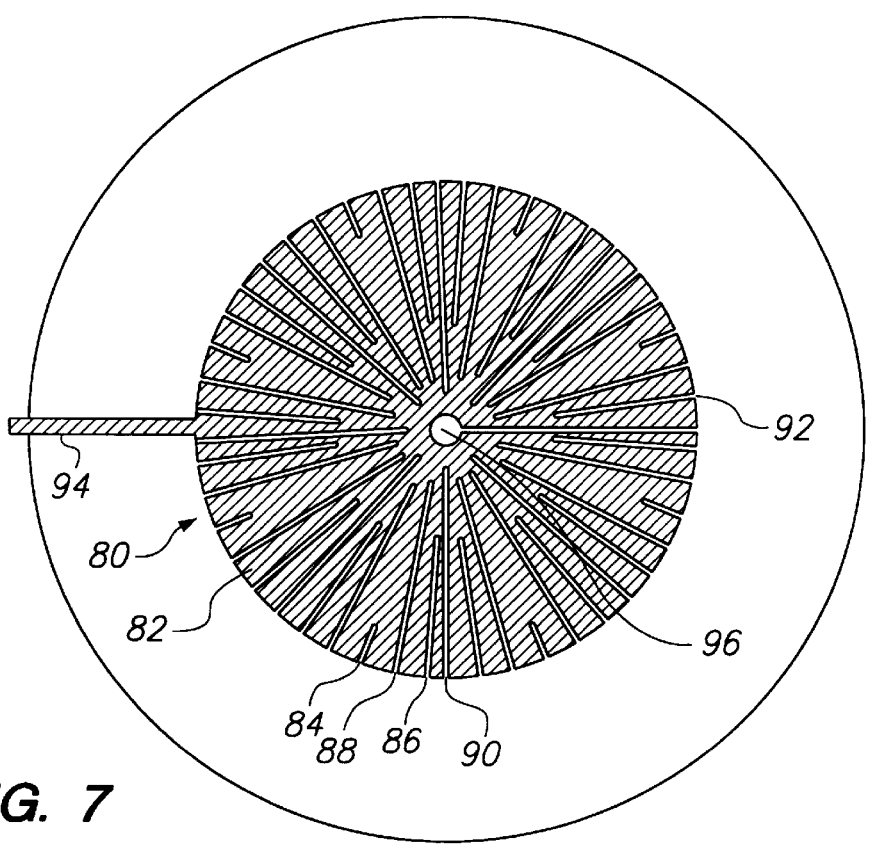
FIG. 7 is a top view of another shield in accordance with the invention.

According to another embodiment, the metal shield can be deposited in a pattern like a conventional Faraday shield (as shown in FIG. 7), and the shield can be either electrically grounded or capacitively coupled to ground. The voltage on the shield capacitively coupled to ground could be controlled by a variable or fixed capacitor to provide a voltage level sufficient to provide enough ion bombardment of the GDP to prevent excessive polymer buildup, but low enough to prevent lightup of the gas delivery grooves and holes.

In the two embodiments of the shield described above, gas hole lightup can be prevented when the shield is electrically grounded. The pattern more like a conventional Faraday shield covers more area, and provides an additional advantage of keeping the GDP very clean of polymer using an etch/ash process. This is a significant advantage in that it reduces the in situ clean time required, thus increasing throughput.

According to one embodiment of the shield, a grounded electrically conductive member is provided between the RF source and the gas distribution holes of the gas distributing member. In order to prevent plasma lightup in the holes, it is only necessary that the shield cover all or part of each hole. In a preferred embodiment, the shield comprises a metallized film which completely covers each hole without providing a circular current path. For instance, the shield can comprise a slotted disk shaped pattern or a series of interconnected strips. Alternatively, the shield can comprise discrete patterns, each of which is electrically grounded. The shield can be provided on either side of the dielectric window. However, if the shield is in contact with the process gas, the material of the shield is preferably inert with respect thereto.

The shield according to the invention can perform functions in addition to preventing plasma lightup in the gas distribution holes. For instance, in the case where the RF source comprises an RF antenna such as a planar or non-planar coil, the shield can have a shape which allows the RF source to strike a plasma in the processing chamber. As an example, if the RF source comprises an RF antenna in the form of an RF coil, the shield can have an outer diameter less than the outer diameter of the coil whereby the portion of the coil beyond the outer diameter of the shield can achieve lightup of plasma in the processing chamber. In the case of a processing chamber for etching 8 inch wafers, the gas distribution holes could be located within the outer diameter of the shield and the outer diameter of the shield could be ½ to 2 inches smaller in diameter than the RF coil.

The shield can be arranged to provide a cleaning function on the inner surface of the gas distribution member, either during processing of a substrate or in a separate step after the substrate is removed from the processing chamber. For instance, by locating the shield on the lower surface of the dielectric window, it is possible to obtain more capacitive coupling of RF power to the plasma and effect sputtering of deposits on the inner surface of the gas distribution member. For purposes of controlling the amount of sputtering, it may be desirable to ground the shield via a set or variable capacitance.

A vacuum processing chamber according to one embodiment of the present invention is illustrated in FIG. 1. The vacuum processing chamber 10 includes a substrate holder 12 providing an electrostatic clamping force to a substrate 13 as well as an RF bias to a substrate supported thereon and a focus ring 14 for confining plasma in an area above the substrate while it is He backcooled. A source of energy for maintaining a high density (e.g. $10^{11}$–$10^{12}$ ions/cm$^3$) plasma in the chamber such as an antenna 18 powered by a suitable RF source and suitable RF impedance matching circuitry inductively couples RF energy into the chamber 10 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. A conical liner 30 extends from the gas distribution plate and surrounds the substrate holder 12. The antenna 18 can be provided with a channel 24 through which a temperature control fluid is passed via inlet and outlet conduits 25,26. However, the antenna 18 and/or window 20 could be cooled by other techniques such as by blowing air over the antenna and window, passing a cooling medium through or in heat transfer contact with the window and/or gas distribution plate, etc.

In operation, a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. patent application Ser. Nos. 08/509,080; 08/658,258; and 08/658,259, the disclosures of which are hereby incorporated by reference. For instance, while the window and gas distribution plate arrangement in FIG. 1 are planar and of uniform thickness, non-planar and/or non-uniform thickness geometries can be used for the window and/or gas distribution plate. A high density plasma is ignited in the space between the substrate and the window by supplying suitable RF power to the antenna 18. A temperature control fluid can also be passed through the channel 24 in the antenna 18 to maintain the antenna 18, window 20 and gas distribution plate 22 at a temperature below a threshold temperature such as less than 120° C., preferably below 90° C. and more preferably below 80° C.

The gas distribution plate can have various designs such as those shown in FIGS. 2–5. The gas distribution plate 40 shown in FIG. 2 includes eighty-nine holes 41 and four embossments 42 near the center thereof for providing a passage for supply gas between the gas distribution plate and the dielectric window. The gas distribution plate 50 shown in FIGS. 3–5 includes thirty-one holes 51, channels 52 for supplying process gas to the holes 51 and the plate is thicker at an outer periphery 54 thereof for purposes of mating with a mounting arrangement of the chamber. The gas distribution plate can be mounted in chambers of the types disclosed in commonly owned U.S. patent application Ser. Nos. 08/658,261, 08/658,262 the disclosures of which are hereby incorporated by reference.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. The etch selectivity, which is the etch rate of the layer to be etched compared to the photoresist etch rate is preferably around 4:1 or higher. The etch selectivity of the oxide layer compared to the underlayer is preferably greater than the oxide:photoresist etch selectively, e.g., 40:1.

According to the invention, the distribution plate provides uniform processing of substrates during processing such as etching of dielectric materials such as silicon dioxide (e.g., doped or undoped TEOS, BPSG, USG (undoped spin-on-glass), thermal oxide, plasma oxide, etc.) typically overlying a conductive layer such as silicon, polysilicon, silicide, titanium nitride, aluminum or a non-conductive material such as silicon nitride. According to the invention, features (such as contact holes, vias, trenches, etc.) can be provided having dimensions of 0.5 μm and below and aspect ratios ranging from 2:1 to 7:1 can be etched from substrate to substrate during sequential batch processing of substrates such as semiconductor wafers (e.g., 25 or more consecutive wafers) while maintaining uniform processing of each successive wafer.

During oxide etching, the chamber pressure is typically below 300 mTorr, preferably 1–40 mTorr, the antenna is powered at 200–5000 watts, preferably 300–2500 watts, the RF bias is ≦6000 watts, preferably 1000–2500 watts, and the He backpressure is 5–40 Torr, preferably 7–20 Torr. The process gas can include 10–200 sccm $CHF_3$, 10–100 sccm $C_2HF_5$ and/or 10–100 sccm $C_2F_6$.

If desired, temperature control of the gas distribution plate 22 can be provided by using channel 24 for circulating a fluid through the antenna 18 from a closed circuit temperature controller 28. The temperature controller preferably monitors the window temperature such as by one or more temperature sensors 27 and controls coolant temperature and/or flow rate of coolant through the antenna 18 to maintain the window below a threshold temperature. The antenna 18 is preferably in good thermal contact with the window 20 to provide adequate heat transfer between the window and the antenna 18. The window is preferably made of a high thermal conductivity dielectric material such as aluminum nitride which maximizes heat transfer from the antenna 18 through the window to the gas distribution plate 22 which can be of any suitable dielectric material such as silicon nitride, alumina, quartz, aluminum nitride, quartz, etc. Properties of aluminum nitride include thermal conductivity of 100 w/m-k, density of 3.27 g/cm$^3$, heat capacity of 0.2 cal/gm-k, and emissivity of 0.75. The heat which is received by the gas distribution plate 22 due to ion bombardment from the plasma is passed through the window 20 and can be removed by passing cooling fluid within the antenna 18, increasing gas pressure between the window and gas distribution plate 22, blowing cooling gas over the antenna and/or adding a light gas such as He to the process gas distributed by the gas distribution plate.

The antenna 18 can have various shapes and profiles such as a substantially planar or non-planar profile such as a flat spiral shape having one or more (e.g., 3 to 7) turns in the spiral. The channel 24 can extend through all portions of the antenna 18 from a cooling fluid inlet to a cooling fluid outlet. For instance, the cooling fluid may flow from the exterior of the spiral antenna 18 toward the center, or from the center to the exterior thereof. The antenna may be bonded to the window by any suitable technique such as brazing, adhesive (e.g., RTV), etc., which provides good heat transfer characteristics between the antenna and the window. The cooling fluid which is passed through the antenna is preferably a non-conducting liquid such as deionized water, ethylene glycol, a conventional heat exchanger oil, or Fluoroinert (a dielectric fluid made by DuPont). Alternatively, the antenna can include a cooling tube which is bonded to a surface, such as a top surface, of the antenna. The cooling fluid is passed through the cooling tube in the same manner as the channel 24.

The gas distribution plate 22 is preferably formed as a separate piece attachable to the reaction chamber. Alternatively, the window 20 and the gas distribution plate 22 may be formed as a single piece. When formed as a single piece, higher thermal conductivity of the window/gas distribution plate 22 arrangement can be provided and/or the heat transfer across the window and the gas distribution plate 22 can be made more uniform. In making a single piece window/gas distribution plate, suitable gas passages and outlet holes can be provided in a green ceramic dielectric material which is later sintered to form a unitary plate. In order to prevent plasma from striking in the passages and/or holes, the dimensions of the passages and holes are preferably small enough to avoid conditions under which plasma would form during flow of process gas and powering of the antenna.

If desired, the gas distribution plate can be made of various blends of silicon nitride based powder material having a predominant amount of silicon nitride. For instance, the total amount of silicon nitride can be at least 90 wt %, preferably ≧95 wt %, and more preferably ≧97 wt %. Examples of suitable compositions include (1) 97.37% Si$_3$N$_4$+1.66 wt % MgO+0.97% SiO$_2$; (2) 98.366% Si$_3$N$_4$+0.908% MgO+0.726% Al$_2$O$_3$; (3) 97.496% Si$_3$N$_4$+1.12% MgO+0.487% SiO$_2$+0.897% Al$_2$O$_3$; and (4) 96.639% Si$_3$N$_4$+1.331% MgO+0.966% SiO$_2$+1.064% Al$_2$O$_3$. The silicon and nitrogen are preferably present in amounts to sufficient achieve a nominal Si$_3$N$_4$ stoichiometry. Such mixtures can be formed into a desired shape, sintered and machined to desired tolerances and/or surface finishes on surfaces such as vacuum sealing surfaces.

Figure 2:
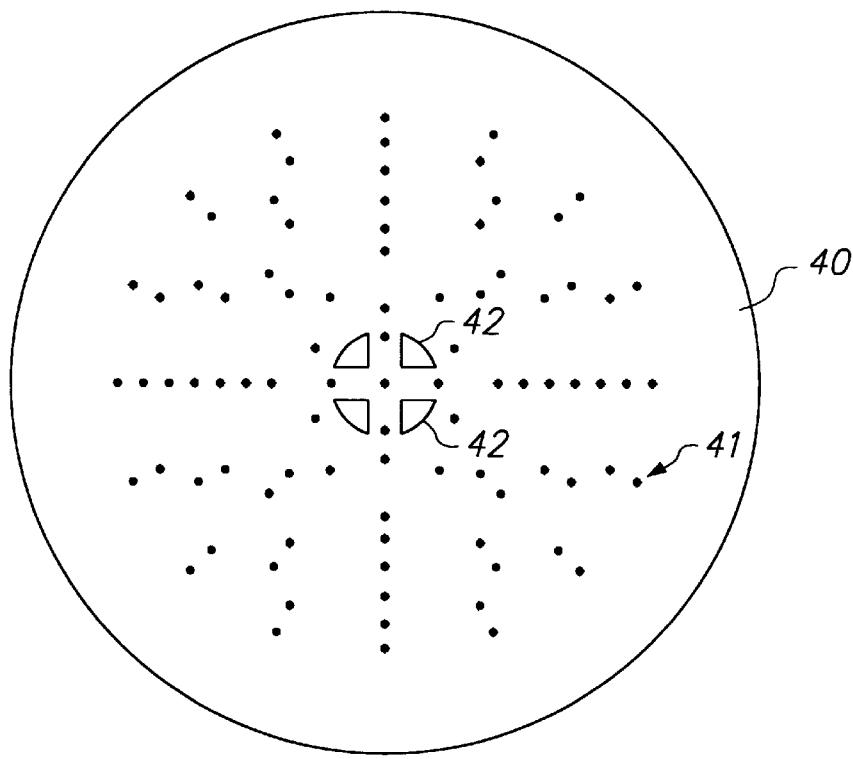
FIG. 2 is a top view of an 89 hole gas distribution plate according to the invention.

The gas distribution plate can include any desired hole pattern. An example of a suitable pattern is shown in FIG. 2 wherein 89 holes having diameters of 0.020 inch are provided. The hole pattern includes a center hole, 4 holes on a 2 inch diameter, 6 holes on a 3 inch diameter, 6 holes on a 4 inch diameter, 8 holes on a 5 inch diameter, 8 holes on a 6 inch diameter, 12 holes on a 7 inch diameter, 12 holes on an 8 inch diameter, 16 holes on a 9 inch diameter, and 16 holes on a 10 inch diameter. The plate also includes 4 embossments 0.020 inch thick near the center of the plate for purposes of separating the plate from the overlying window.

Figure 3:
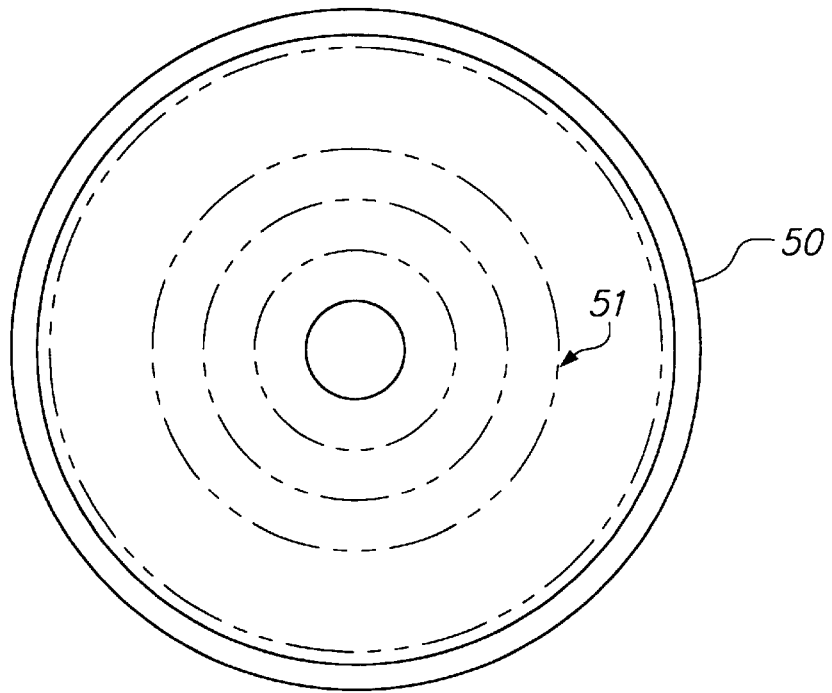
FIG. 3 is a view of one side of a 31 hole gas distribution plate according to the invention.
Figure 4:
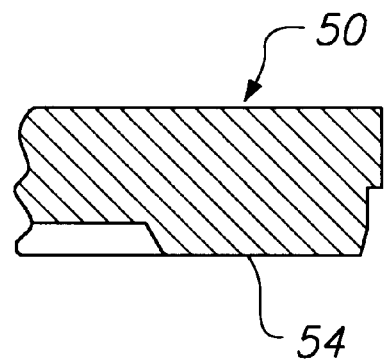
FIG. 4 is a cross-section of an outer edge of the gas distribution plate shown in FIG. 2.
Figure 5:
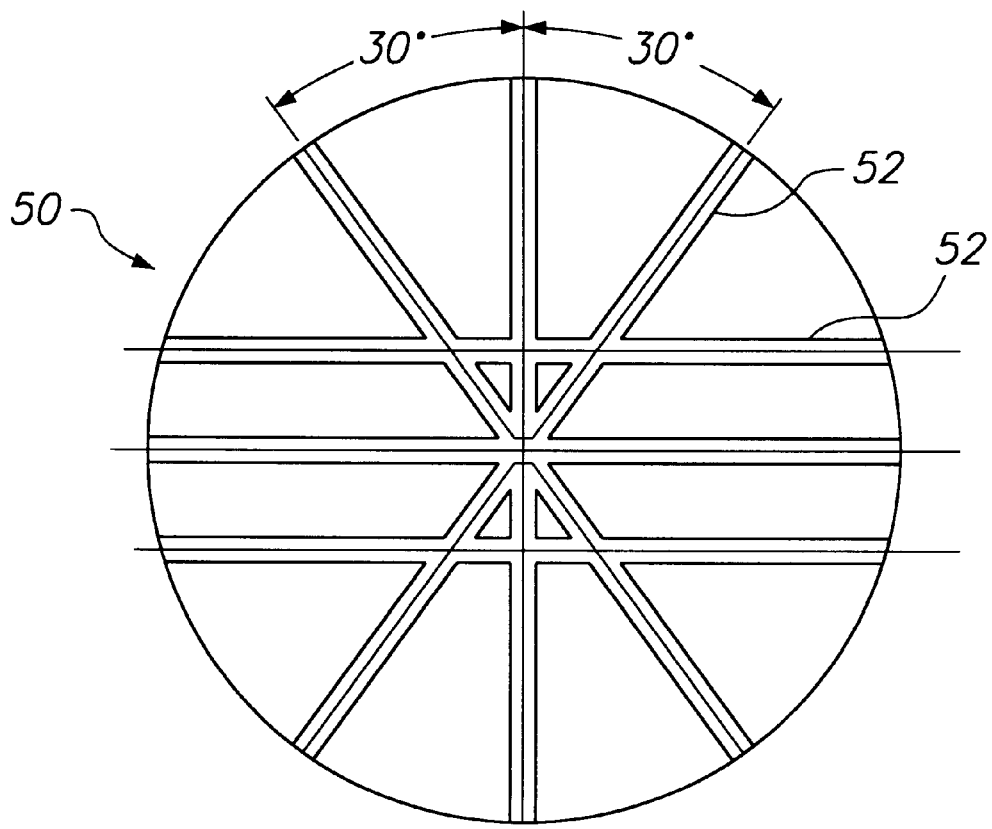
FIG. 5 is a view of an opposite side of the gas distribution plate shown in FIG. 2.

FIG. 3 shows a gas distribution plate according to the invention having 31 holes with 0.025 inch diameters. The hole pattern includes a center hole, 4 holes on a 2 inch diameter, 6 holes on a 4 inch diameter, 8 holes on a 6 inch diameter and 12 holes on an 8 inch diameter. The plate also includes a thicker outer edge thereof as shown in FIG. 4. Further, the surface of the plate facing the overlying window includes a pattern of rectangular grooves therein which distribute process gas to the gas outlets shown in FIG. 3. As shown in FIG. 5, 6 radially extending grooves are provided which are each 0.015 inch deep and 0.35 inch wide.

In the case where the electric field produced by the antenna is of sufficient strength to light a plasma in the holes of the gas distribution plate, the antenna can be located such that portions thereof do not overlie any outlet holes in the gas distribution plate. For instance, if the antenna comprises a multi-turn coil and the gas distribution plate includes a center hole and various holes located on one more circles at fixed radii from the center hole, the antenna can be located such that any turn passing through the circles is located between a pair of adjacent holes located on the circles. Such positioning of the antenna would further minimize the possibility of striking a plasma in the holes located closest to the antenna.

FIG. 6 shows a shield 60 comprised of a series of strips, of which strips 62, 64, 66, 68, 70, 72 extend in a direction which passes through a center axis of the dielectric window or gas distribution plate and strips 74, 76 extend in a direction parallel to each other and parallel to strip 62. Strips 62 and 66 intersect at the central axis, strips 64 and 69 intersect strip 76 and strips 70 and 72 intersect strip 78. For instance, in the case of a 31 hole GDP where the gas distribution holes have a diameter of 0.025 inch, the strips can have a width of 0.25 inch and a thickness of about 0.001 inch.

FIG. 7 shows a shield 80 in the form of a slotted disk having slots 84, 86, 88, 90, 92 of progressively longer lengths. For example, the slots can have a width of 0.125 inch and lengths ranging from ½ inch to the radius of the shield. A strip 94 provides a connection to ground either directly or through a fixed or variable capacitor. In order to prevent eddy currents from traveling completely around the disk 82, slot 92 extends to a hole 96 located on the center axis of the disk 82.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of processing a substrate and improving uniformity of processing thereof comprising steps of:

(a) placing a substrate on a substrate holder in a processing chamber, the processing chamber including a gas distribution member having an exposed surface facing the substrate, the gas distribution member including gas distribution holes through which process gas flows into a reaction zone adjacent the substrate;

(b) flowing process gas through the gas distribution holes into the processing chamber and igniting the process gas in the processing chamber into a plasma state by capacitively coupling RF energy from an RF energy source through the gas distribution member and into the processing chamber, the processing chamber including a grounded shield between the RF energy source and the gas distribution holes, the shield comprising a metallized pattern on an inner or outer surface of a dielectric window located between the gas distribution member and the RF energy source, the shield preventing lightup of plasma in the gas distribution holes without preventing capacitive coupling of RF energy from the RF energy source into the processing chamber for lightup of plasma in the processing chamber;

(c) processing the substrate by inductively coupling RF energy from the RF energy source through the gas distribution member and maintaining the process gas in a plasma state in the processing chamber, the shield effecting ion bombardment of the exposed surface of the gas distribution member;

(d) removing the substrate from the processing chamber; and (e) consecutively processing additional substrates in the processing chamber by repeating steps (a–d) while maintaining a desired spatial distribution of process gas flow through the gas distribution holes due to lack of lightup of plasma in the gas distribution holes.

2. The method according to claim 1, wherein during the processing step the RF energy source comprises a substantially planar antenna which energizes the process gas into the plasma state by supplying RF power to the antenna and the process gas comprises one or more halogen containing gases which etch the substrate during the processing step.

3. The method according to claim 1, wherein during the processing step the plasma comprises a high density plasma and the substrates are processed by etching a layer on the substrates with the high density plasma while supplying an RF bias to the substrates.

4. The method according to claim 1, wherein the metallized pattern is directly or capacitively coupled to ground.

5. The method according to claim 1, wherein the processing chamber includes a dielectric window adjacent an outer surface of the gas distribution member, the gas distribution member having a plurality of gas outlets extending through the exposed surface and a plurality of gas distributing channels in the outer surface, the outer surface being in contact with the dielectric window and the gas distributing channels supplying the process gas to the gas outlets during the process step, the shield being between the RF energy source and the gas distributing channels, the shield preventing lightup of plasma in the gas distributing channels during the processing step.

6. The method according to claim 1, wherein the metallized pattern substantially covers the inner or outer surface of the dielectric window, the ion bombardment of the exposed surface of the gas distribution member being sufficient to reduce buildup on the exposed surface of the gas distribution member during the processing step.

7. The method according to claim 1, wherein the shield comprises a metallized pattern comprised of interconnected strips of electrically conductive metal.

8. The method according to claim 1, wherein the shield comprises a metallized pattern comprised of a slotted disk wherein slots extend radially inward from an outer periphery of the disk.

9. The method according to claim 1, wherein the shield comprises a metallized pattern comprised of a slotted disk wherein slots of varying lengths extend radially inward from an outer periphery of the disk.

10. A plasma processing chamber comprising:

a substrate holder for supporting a substrate within an interior of the processing chamber;

a gas distribution member having an exposed surface facing the substrate, the gas distribution member including gas distribution holes through which process gas flows into the interior of the processing chamber into a reaction zone adjacent a substrate supported on the substrate holder;

a gas supply supplying process gas through the gas distribution holes and into the reaction zone;

an RF energy source supplying RF energy into the interior of the processing chamber and energizing the process gas into a plasma state for processing a substrate; and a grounded shield between the RF energy source and the gas distribution holes, the shield comprising a metallized pattern on an inner or outer surface of a dielectric window located between the gas distribution member and the RF energy source, the shield preventing lightup of plasma in the gas distribution holes without preventing capacitive coupling of RF energy from the RF energy source into the processing chamber for lightup of plasma in the processing chamber, the shield effecting ion bombardment of the exposed surface of the gas distribution member during processing of a substrate.

11. The plasma processing chamber according to claim 10, wherein the processing chamber further comprises a dielectric window adjacent the gas distribution member, the shield comprising a metallized pattern on a surface of the window.

12. The plasma processing chamber according to claim 10, wherein the processing chamber includes a dielectric window and the RF energy source comprises a substantially planar antenna adjacent the window, the antenna supplying RF power through the window to energize the process gas in the processing chamber into a plasma state.

13. The plasma processing chamber according to claim 10, wherein the metallized pattern is directly or capacitively coupled to ground.

14. The plasma processing chamber according to claim 10, wherein the processing chamber includes a dielectric window adjacent an outer surface of the gas distribution member, the gas distribution member having a plurality of gas outlets extending through the exposed surface and a plurality of gas distributing channels in the outer surface, the outer surface being in contact with the dielectric window and the gas distributing channels supplying the process gas to the gas outlets, the shield being between the RF energy source and the gas distributing channels, the shield preventing lightup of plasma in the gas distributing channels while the RF energy source energizes the process gas into a plasma state.

15. The plasma processing chamber according to claim 11, wherein the dielectric window and/or the gas distribution member has a substantially uniform thickness and substantially planar configuration.

16. The plasma processing chamber according to claim 10, wherein the gas distribution member includes a plurality of radially extending channels on an outer surface thereof and a plurality of gas outlets on the exposed surface, the gas distribution holes extending between the channels and the gas outlets, and the channels supplying the process gas to the gas outlets, the gas outlets supplying a mass flow of the process gas which is substantially higher in a central portion of the reaction zone.

17. The plasma processing chamber according to claim 16, wherein a cross sectional area of the central portion comprises at least 60% of the reaction zone.

18. The plasma processing chamber according to claim 10, wherein the metallized pattern substantially covers the inner or outer surface of the dielectric window, the shield effecting ion bombardment sufficient to reduce buildup on the exposed surface of the gas distribution member.

19. The plasma processing chamber according to claim 10, wherein the shield comprises a metallized pattern comprised of strips of metal extending from a central portion of the gas distribution member toward an outer periphery of the gas distribution member or a metallized pattern comprised of a slotted disk wherein slots of varying lengths extend radially inward from an outer periphery of the disk.

20. The plasma processing chamber according to claim 10, wherein the shield comprises a metallized pattern which is directly or capacitively coupled to ground.

* * * * *